US008017962B2

(12) United States Patent
Chen et al.

(10) Patent No.: US 8,017,962 B2
(45) Date of Patent: Sep. 13, 2011

(54) LIGHT-EMITTING DIODE APPARATUS AND MANUFACTURING METHOD THEREOF

(75) Inventors: Shih-Peng Chen, Taoyuan Hsien (TW);
Chia-Hua Chan, Taoyuan Hsien (TW);
Horng-Jou Wang, Taoyuan Hsien (TW);
Ching-Liang Lin, Taoyuan Hsien (TW);
Chii-Chang Chen, Taoyuan Hsien (TW); Cheng-Yi Liu, Taoyuan Hsien (TW); Huang-Kun Chen, Taoyuan Hsien (TW)

(73) Assignees: Delta Electronics, Inc., Taoyuan Hsien (TW); National Central University, Jhongli, Taoyuan County (TW)

( * ) Notice: Subject to any disclaimer, the term of this patent is extended or adjusted under 35 U.S.C. 154(b) by 430 days.

(21) Appl. No.: 12/193,271

(22) Filed: Aug. 18, 2008

(65) Prior Publication Data
US 2009/0072259 A1     Mar. 19, 2009

(30) Foreign Application Priority Data
Sep. 13, 2007   (TW) ............................... 96134165 A

(51) Int. Cl.
*H01L 33/60*     (2010.01)

(52) U.S. Cl. ............................... 257/98; 438/29; 438/42
(58) Field of Classification Search ................... 257/95, 257/98, 233, 599, E33.059; 438/22–29, 42
See application file for complete search history.

(56) References Cited

U.S. PATENT DOCUMENTS 6,900,473 B2 *   5/2005   Yoshitake et al. ............... 257/95
2008/0283859 A1 * 11/2008 Chen et al. ...................... 257/98

* cited by examiner

*Primary Examiner* — Calvin Lee
(74) *Attorney, Agent, or Firm* — Muncy, Geissler, Olds & Lowe, PLLC

(57) ABSTRACT

A light-emitting diode (LED) apparatus includes a thermoconductive substrate, a thermoconductive adhesive layer, an epitaxial layer, a current spreading layer and a micro- or nano-roughing structure. The thermoconductive adhesive layer is disposed on the thermoconductive substrate. The epitaxial layer is disposed opposite to the thermoconductive adhesive layer and has a first semiconductor layer, an active layer and a second semiconductor layer. The current spreading layer is disposed between the second semiconductor layer of the epitaxial layer and the thermoconductive adhesive layer. The micro- or nano-roughing structure is disposed on the first semiconductor layer of the epitaxial layer. In addition, a manufacturing method of the LED apparatus is also disclosed.

14 Claims, 6 Drawing Sheets

LIGHT-EMITTING DIODE APPARATUS AND MANUFACTURING METHOD THEREOF

CROSS REFERENCE TO RELATED APPLICATIONS

This Non-provisional application claims priority under 35 U.S.C. §119(a) on Patent Application No(s). 096134165 filed in Taiwan, Republic of China on Sep. 13, 2007, the entire contents of which are hereby incorporated by reference.

BACKGROUND OF THE INVENTION

1. Field of Invention

The invention relates to a light-emitting diode (LED) apparatus having a micro- or nano-structure and a manufacturing method thereof.

2. Related Art

A light-emitting diode (LED) apparatus is a lighting apparatus made of semiconductor materials. The LED apparatus pertains to a cold lighting apparatus, has the advantage of the low power consumption, the long lifetime, the high response speed and the small size and can be manufactured into an extremely small or array-type apparatus. With the continuous progress of the recent technology, the LED apparatus can be applicable to an indicator of a computer or a home appliance product, a backlight source of a liquid crystal display (LCD) apparatus, a traffic sign or a vehicle indicator.

However, the current LED apparatus still has the problems of the poor light-emitting efficiency and the low luminance. The reason causing the poor light-emitting efficiency is that the light emitted from the LED apparatus is the omni-direction light and is not simply focused on a certain location. In addition, only a portion of the light generated by the LED can be outputted, and the other portion of the light is absorbed due to reflection. Consequently, the luminance of the LED apparatus is decreased, and the heat generated by the LED apparatus is also increased.

In general, the LED apparatus may be a flip-chip type LED apparatus, a vertical type LED apparatus or a front-side type LED apparatus. In order to solve the problem of the low light emitting efficiency caused by the reflection, the following technology has been proposed. As shown in FIG. 1, a LED apparatus 1, such as a vertical type LED apparatus, has an n-type semiconductor doping layer 121, an active layer 122 and a p-type semiconductor doping layer 123 sequentially formed on a surface of a substrate 11. Next, a current spreading layer 13 is formed on the p-type semiconductor doping layer 123, and a first electrode 14 and a second electrode 15 are respectively formed on the current spreading layer 13 and the other surface of the substrate 11.

As shown in FIG. 1, a light output surface 131 of the current spreading layer 13 is etched to form a roughing surface by a photo process in conjunction with the etching technology. Thus, the condition of the total reflection of light on the light output surface can be alleviated, and the light extracting efficiency can be increased.

Although the above-mentioned solution can solve the problem of the total reflection, the photo process and the etching technology have to be performed using expensive manufacturing apparatuses so that the manufacturing cost is increased. In addition, the structure of the above-mentioned LED apparatus also has the drawback of the poor thermoconductive property.

Therefore, there is a need to provide a light-emitting diode (LED) apparatus and a manufacturing method capable of decreasing the manufacturing cost and increasing the thermoconductive efficiency.

SUMMARY OF THE INVENTION

In view of the foregoing, an object of the present invention is to provide a light-emitting diode (LED) apparatus and a manufacturing method capable of decreasing the manufacturing cost and increasing the thermoconductive efficiency.

To achieve the above, the invention discloses a light-emitting diode (LED) apparatus including a thermoconductive substrate, a thermoconductive adhesive layer, an epitaxial layer, a current spreading layer and a micro- or nano-roughing structure. The thermoconductive adhesive layer is disposed on the thermoconductive substrate. The epitaxial layer is disposed opposite to the thermoconductive adhesive layer and has a first semiconductor layer, an active layer and a second semiconductor layer in sequence. The current spreading layer is disposed between the second semiconductor layer of the epitaxial layer and the thermoconductive adhesive layer. The micro- or nano-roughing structure is disposed on the first semiconductor layer of the epitaxial layer.

To achieve the above, the invention also discloses a manufacturing method of a light-emitting diode (LED) apparatus. The method includes the steps of: forming an epitaxial layer on an epitaxial substrate; forming a current spreading layer on the epitaxial layer; forming a reflective layer on the current spreading layer; forming a thermoconductive insulating layer on the reflective layer; combining a thermoconductive substrate with the thermoconductive insulating layer through a thermoconductive adhesive layer; removing the epitaxial substrate; and forming a micro- or nano-structure on the epitaxial layer.

As mentioned above, the micro- or nano-roughing structure is directly disposed on the epitaxial layer in the LED apparatus and the manufacturing method thereof according to the invention. Thus, the phenomenon of the total reflection of light emitted from the active layer can be decreased. In addition, the thermoconductive substrate, the thermoconductive adhesive layer, the thermoconductive insulating layer and the reflective layer constitute a good thermoconductive path for conducting out the heat generated by the epitaxial layer. In addition, the micro- or nano-roughing structure is composed of the nano-balls and the nano-concave-convex structure, and the photo process and the etching technology can be omitted so that the manufacturing cost can be lowered.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
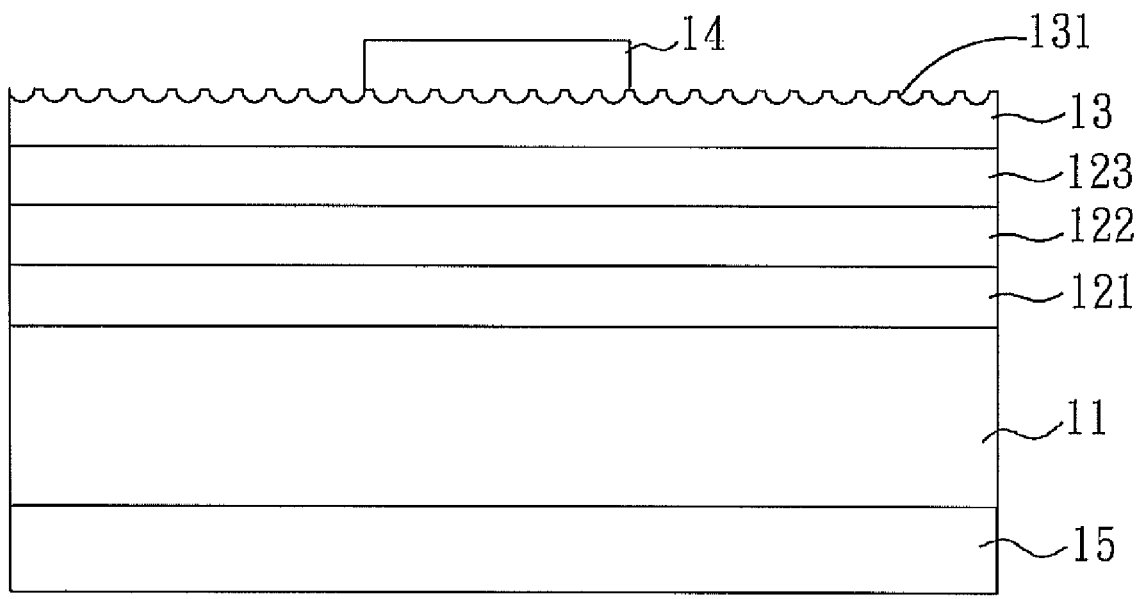
FIG. 1 is a schematic illustration showing a conventional LED apparatus.
Figure 2:
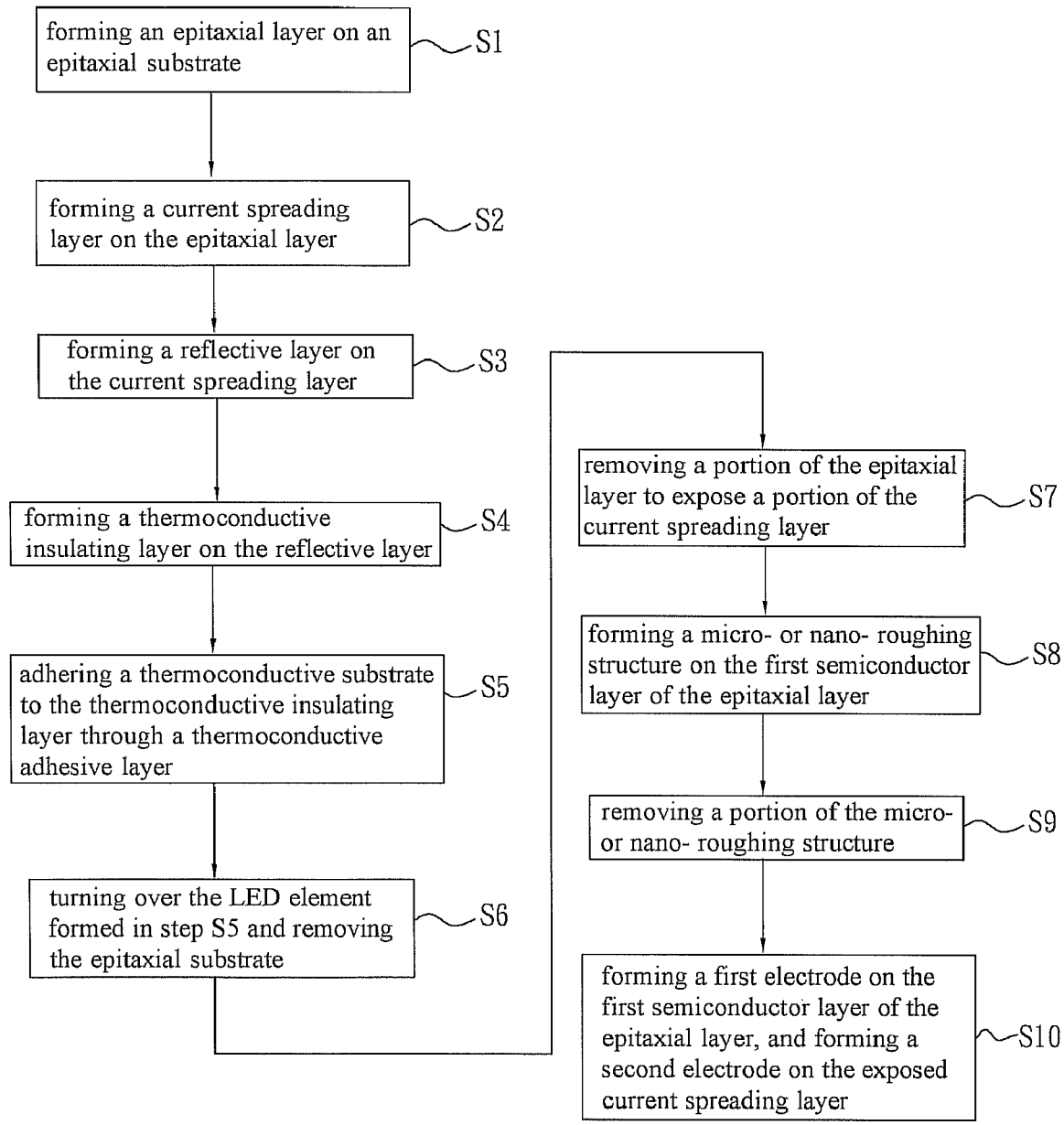
FIG. 2 is a flow chart showing a manufacturing method of a LED apparatus according to a preferred embodiment of the invention.

FIG. 2 is a flow chart showing a manufacturing method of a light-emitting diode (LED) apparatus 2 according to a preferred embodiment of the invention. Referring to FIG. 2, the manufacturing method of the LED apparatus 2 according to the preferred embodiment of the invention includes steps S1 to S10. Illustrations will be made according to FIG. 2 in conjunction with FIGS. 3A to 3J.

Figure 3A:
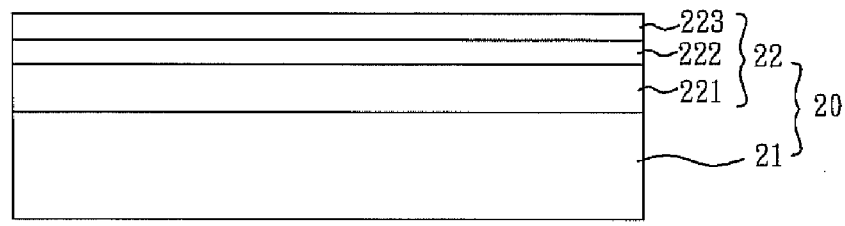
FIGS. 3A to 3J are schematic illustrations showing the LED apparatus in conjunction with FIG. 2.

As shown in FIG. 3A, an epitaxial layer 22 is formed on an epitaxial substrate 21 in the step S1. The epitaxial layer 22 includes a first semiconductor layer 221, an active layer 222 and a second semiconductor layer 223 formed on the epitaxial substrate 21 in sequence. In this embodiment, the first semiconductor layer 221 and the second semiconductor layer 223 are respectively an N-type epitaxial layer and a P-type epitaxial layer or respectively a P-type epitaxial layer and an N-type epitaxial layer.

Figure 3B:
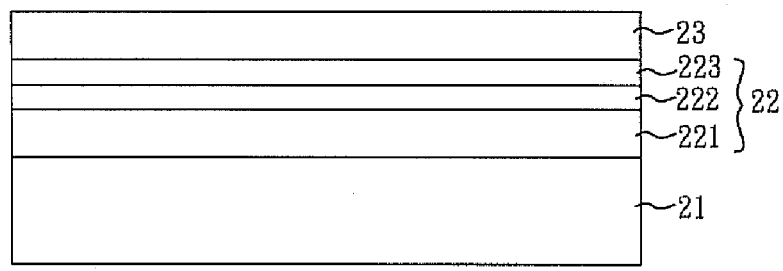

As shown in FIG. 3B, a current spreading layer 23 is formed on the epitaxial layer 22 in the step S2. In this embodiment, the current spreading layer 23 is a transparent conductive layer formed on the second semiconductor layer 223 of the epitaxial layer 22. The material of the current spreading layer 23 can be, for example but not limited to, indium tin oxide (ITO), aluminum doped zinc oxide (AZO), zinc oxide (ZnO), nickel/gold (Ni/Au) or antimony tin oxide, according to the priority consideration of uniformly spreading the currents.

Figure 3C:
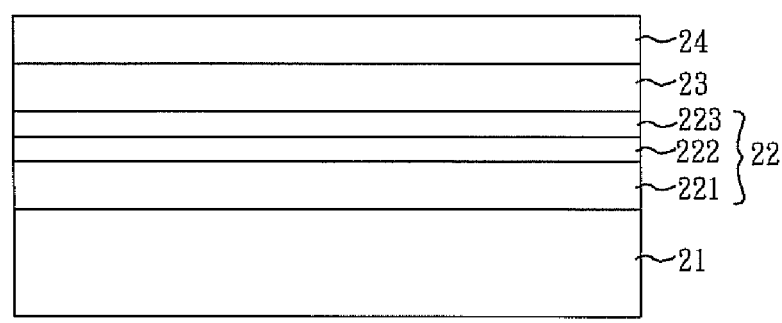

As shown in FIG. 3C, a reflective layer 24 is formed on the current spreading layer 23 in the step S3. In this embodiment, the material of the reflective layer 24 can be aluminum, platinum, gold, silver, palladium, nickel, chromium, titanium or a combination thereof. In addition, the reflective layer 24 may be an optical reflective device, a metal reflective layer or a metal dielectric reflective layer, which is composed of multiple dielectric layers with different refractive indexes. That is, the reflective layer 24 can be composed of a plurality of materials combined or stacked together.

Figure 3D:
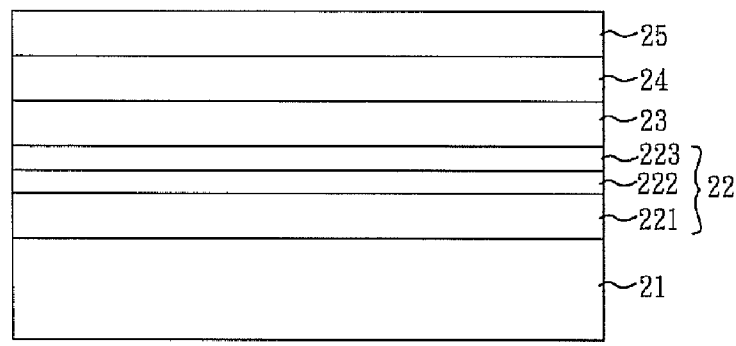

As shown in FIG. 3D, a thermoconductive insulating layer 25 is formed on the reflective layer 24 in the step S4. In this embodiment, the material of the thermoconductive insulating layer 25 can be nitride, oxide, carbide, a dielectric material, such as aluminum nitride or silicon carbide, or an insulating material having a high coefficient of thermal conductivity. In addition, the refractive index of the epitaxial layer 22 is greater than the refractive index of the thermoconductive insulating layer 25, which is greater than the refractive index of the air. That is, the refractive index of the thermoconductive insulating layer 25 ranges between the refractive index of the epitaxial layer 22 and the refractive index of the air.

Figure 3E:
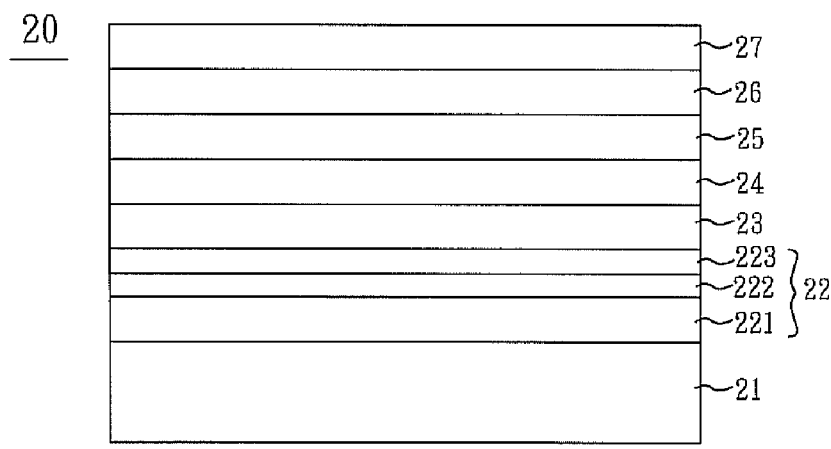

As shown in FIG. 3E, a thermoconductive substrate 27 is adhered to the thermoconductive insulating layer 25 through a thermoconductive adhesive layer 26 to form a LED element 20 in the step S5. In this embodiment, the material of the thermoconductive adhesive layer 26 can be gold, soldering paste, tin-silver paste, silver paste or a combination thereof, or can be an eutectic bonding material, such as silicon-gold (Si—Au), gold-tin (Au—Sn), or the like. The material of the thermoconductive substrate 27 can be silicon, gallium arsenide, gallium phosphide, silicon carbide, boron nitride, aluminum, aluminum nitride, copper or a combination thereof.

Figure 3F:
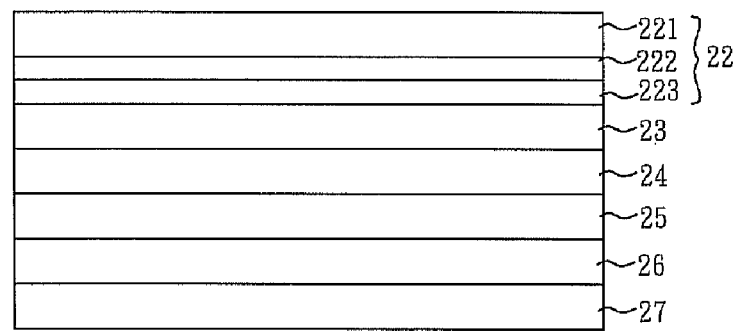

As shown in FIG. 3F, the LED element 20 formed in the step S5 is turned over and the epitaxial substrate 21 is removed in the step S6.

Figure 3G:
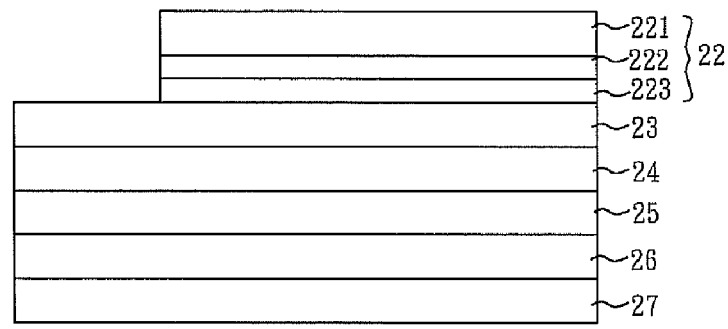

As shown in FIG. 3G, a portion of the epitaxial layer 22 is removed to expose a portion of the current spreading layer 23 in the step S7. Alternatively, a portion of the first semiconductor layer 221 and the active layer 222 are removed to expose a portion of the second semiconductor layer 223 (not shown).

Figure 3H:
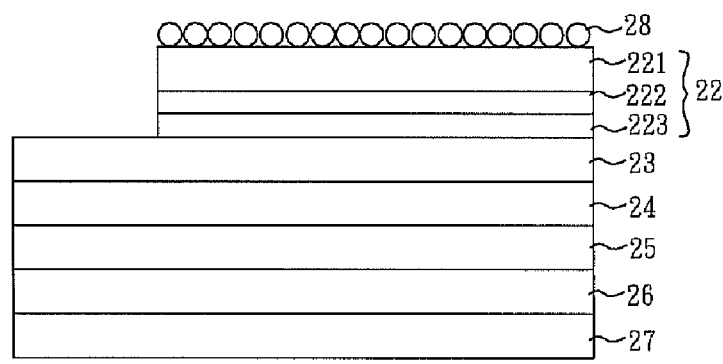

As shown in FIG. 3H, a micro- or nano-roughing structure 28 is formed on the first semiconductor layer 221 of the epitaxial layer 22 in the step S8. The refractive index of the micro- or nano-roughing structure 28 is greater than the refractive index of the air smaller than the refractive index of the epitaxial layer 22. The micro- or nano-roughing structure 28 can be formed by, for example but not limited to, stacking or sintering a plurality of nano-balls or a nano-concave-convex structure.

In this embodiment, the nano-balls may have the same or different diameters. Each nano-ball can be an organic polymer formed after organic monomers with unsaturated bonds are polymerized. The organic polymer can be a styrene series, an acrylic acid series, a malein acid series or a combination thereof. Alternatively, the nano-ball is composed of an inorganic component and an organic component, and a material of the nano-ball is a carbon-silicon series, a carbon-titanium series, a carbon-zirconium series, a carbon-aluminum series or a combination thereof. Alternatively, the nano-ball is composed of an inorganic component, which can be silicon, titanium, zirconium, gold, silver, iron, aluminum, copper, zinc or a combination thereof.

In addition, the nano-balls can provide the anti-reflective function and are formed on the first semiconductor layer 221 of the epitaxial layer 22 by way of dip coating, spin coating, spray coating and/or nature drying.

Figure 3I:
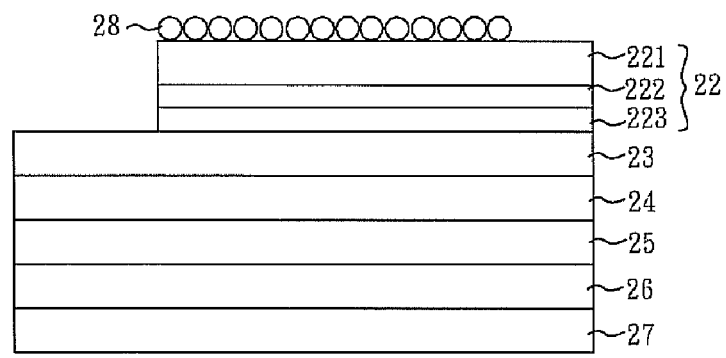

As shown in FIG. 3I, a portion of the micro- or nano-roughing structure 28 is removed to expose a portion of the first semiconductor layer 221 in the step S9.

Figure 3J:
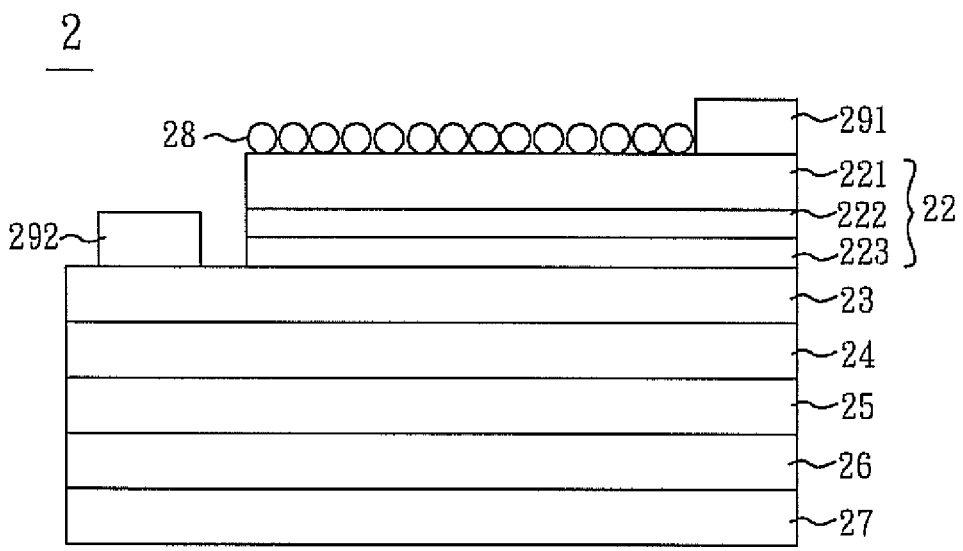

In the step S10, a first electrode 291 is formed on the first semiconductor layer 221 exposed to the micro- or nano-roughing structure 28, and a second electrode 292 is formed on the exposed current spreading layer 23 or the exposed second semiconductor layer 223 (not shown) to constitute a front-side type LED apparatus 2, as shown in FIG. 3J. In this embodiment, the order of the above-mentioned steps may be changed according to the requirement in the manufacturing processes. For example, after the step S7, the first electrode 291 can be firstly formed on the exposed first semiconductor layer 221, and the second electrode 292 is formed on the exposed current spreading layer 23, and then the micro- or nano-roughing structure 28 is formed.

Figure 4:
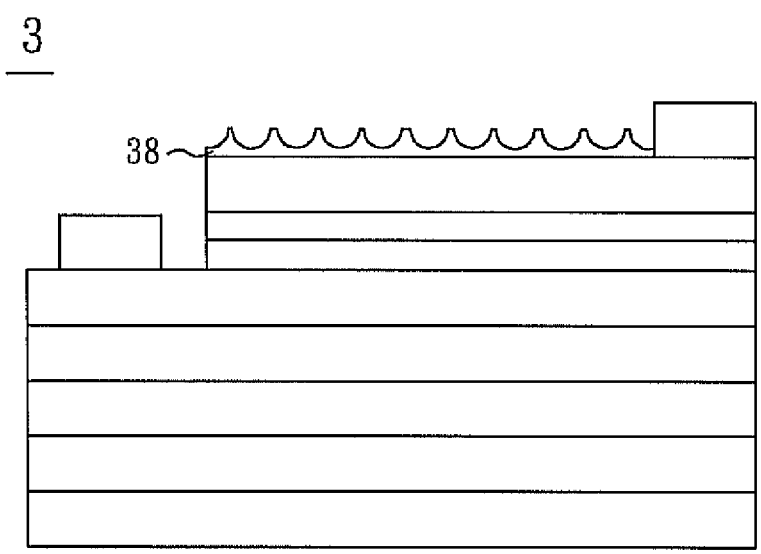
FIG. 4 is a schematic illustration showing another LED apparatus according to the preferred embodiment of the invention.

FIG. 4 is a schematic illustration showing another LED apparatus 3, which has a micro- or nano-roughing structure 38 composed of a nano-concave-convex structure, according to the preferred embodiment of the invention. The nano-concave-convex structure is, for example, a mesh-like nano-concave-convex structure, and the material thereof is aluminum oxide (Al2O3), silicon nitride (Si3N4), tin dioxide (SnO2), silicon dioxide (SiO2), resin, polycarbonate or a combination thereof.

In summary, the micro- or nano-roughing structure is directly disposed on the epitaxial layer in the LED apparatus and the manufacturing method thereof according to the invention. Thus, the phenomenon of the total reflection of light emitted from the active layer can be decreased. In addition, the thermoconductive substrate, the thermoconductive adhesive layer, the thermoconductive insulating layer and the reflective layer constitute a good thermoconductive path for conducting out the heat generated by the epitaxial layer. In addition, the micro- or nano-roughing structure is composed of the nano-balls and the nano-concave-convex structure, and the photo process and the etching technology can be omitted so that the manufacturing cost can be lowered.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A light-emitting diode (LED) apparatus comprising:
   a thermoconductive substrate;
   an adhesive layer disposed on the thermoconductive substrate;
   an epitaxial layer disposed at one side of the adhesive layer;
   a current spreading layer disposed between the epitaxial layer and the adhesive layer; and
   a micro- or nano-roughing structure disposed on the epitaxial layer.

2. The LED apparatus according to claim 1, wherein the epitaxial layer has a first semiconductor layer, an active layer and a second semiconductor layer in sequence, one of the first and second semiconductor layers is a P-type epitaxial layer and the other is an N-type epitaxial layer.

3. The LED apparatus according to claim 1, wherein a portion of the current spreading layer is exposed, and the LED apparatus further comprises:
   a first electrode disposed on the epitaxial layer; and
   a second electrode disposed on the exposed current spreading layer or the epitaxial layer.

4. The LED apparatus according to claim 1, wherein a material of the thermoconductive substrate comprises silicon, gallium arsenide, gallium phosphide, silicon carbide, boron nitride, aluminum, aluminum nitride, copper or a combination thereof, and a material of the adhesive layer comprises gold, a solder paste, a solder-silver paste, a silver paste, a combination thereof, an eutectic bonding material, silicon-gold (Si—Au), gold-tin (Au—Sn) or a thermoconductive material.

5. The LED apparatus according to claim 1, further comprising:
   an insulating layer disposed between the adhesive layer and the current spreading layer; and
   a reflective layer disposed between the insulating layer and the current spreading layer.

6. The LED apparatus according to claim 5, wherein a refractive index of the insulating layer ranges between that of the epitaxial layer and that of air.

7. The LED apparatus according to claim 5, wherein a material of the insulating layer comprises nitride, oxide, carbide or a dielectric material, aluminum nitride, silicon carbide or a thermoconductive material with a high coefficient of thermal conductivity, and a material of the reflective layer comprises aluminum, platinum, gold, silver, palladium, nickel, chromium, titanium or a combination thereof.

8. The LED apparatus according to claim 5, wherein the reflective layer is an optical reflective device composed of dielectric films with different refractive indexes, a metal reflective layer or a metal dielectric reflective layer.

9. The LED apparatus according to claim 1, wherein the micro- or nano-roughing structure has a refractive index ranging between that of the epitaxial layer and that of air.

10. The LED apparatus according to claim 1, wherein the micro- or nano-roughing structure comprises a plurality of nano-balls or a nano-concave-convex structure, and the nano-balls have the same diameter or different diameters.

11. The LED apparatus according to claim 10, wherein each of the nano-balls is an organic polymer formed after organic monomers with unsaturated bonds are polymerized, and the organic polymer comprises a styrene series, an acrylic acid series, a malein acid series or a combination thereof.

12. The LED apparatus according to claim 10, wherein the nano-balls are composed of an inorganic component and an organic component, and a material of the nano-balls comprises a carbon-silicon series, a carbon-titanium series, a carbon-zirconium series, a carbon-aluminum series or a combination thereof.

13. The LED apparatus according to claim 10, wherein the nano-balls comprises an inorganic component, and a material of the nano-balls comprises silicon (Si), titanium (Ti), zirconium (Zr), gold (Au), silver (Ag), iron (Fe), aluminum (Al), copper (Cu), zinc (Zn) or a combination thereof.

14. The LED apparatus according to claim 10, wherein the nano-concave-convex structure is a mesh-like nano-concave-convex structure, and a material of the nano-concave-convex structure comprises $Al_2O_3$, $Si_3N_4$, $SnO_2$, $SiO_2$, resin, polycarbonate or a combination thereof.

* * * * *